United States Patent
Sakamoto et al.

(10) Patent No.: US 6,444,547 B2
(45) Date of Patent: *Sep. 3, 2002

(54) METHOD FOR MANUFACTURING SEMICONDUCTOR DEVICE

(75) Inventors: Kazuhisa Sakamoto; Koichi Kitaguro, both of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/218,010

(22) Filed: Dec. 22, 1998

(30) Foreign Application Priority Data

Dec. 25, 1997 (JP) .............................. 9-355968

(51) Int. Cl.[7] .............................................. H01L 21/36
(52) U.S. Cl. ...................................... 438/508; 438/507
(58) Field of Search ................................ 438/499, 139, 438/133, 492, 495, 503, 507, 508, 509, 341, 356, 363, 413, 414, 416, 442, 481, 541, 537, 540, 535

(56) References Cited

U.S. PATENT DOCUMENTS

| | | | | |
|---|---|---|---|---|
| 4,717,681 A | * | 1/1988 | Curran | 438/314 |
| 5,006,476 A | * | 4/1991 | De Jong et al. | 437/31 |
| 5,238,869 A | * | 8/1993 | Shichijo et al. | 438/492 |
| 5,372,960 A | * | 12/1994 | Davies et al. | 437/44 |
| 5,541,121 A | * | 7/1996 | Johnson | 437/31 |
| 5,639,299 A | * | 6/1997 | Inoue et al. | 117/2 |

FOREIGN PATENT DOCUMENTS

JP    8-264552    11/1996

OTHER PUBLICATIONS

Wolf et al., "Silicon Processing for the VLSI Era", 1986, vol. 1—Process Technology, pp. 57–58 and 139–141.*
Chand et al, GaAs Avalanche Photodiodes and the Effect of Rapid Thermal Annealing on Crystalline Quality of GaAs Grown on Si by Molecular–Beam Epitaxy, 1987, J. Vac. Sci. Technol., vol. 5, No. 3, pp. 822–826.*
Semiconductor Silicon Crystal Engineering, by Tadao Shimura, copyrighted by Fumio Shimura, 1993, ISBN 4–621–03876–1 C3055, and partial translation thereof.

* cited by examiner

*Primary Examiner*—Michael Trinh
*Assistant Examiner*—Jeff Vockrodt
(74) *Attorney, Agent, or Firm*—Arent Fox Kintner Plotkin & Kahn, PLLC

(57) ABSTRACT

The present invention is characterized by providing epitaxial growth of a semiconductor layer on the surface of a wafer not provided with mirror finishing and having irregularity, introducing impurities having different conductivity type in the epitaxially grown semiconductor layer to form at least a pn junction, and further providing rapid thermal anneal by rapid heating-up and rapid cooling-down in any step in the manufacturing process. By so processing, there can be obtained a semiconductor device having high speed switching characteristics in stable manner without causing problems in manufacturing process such as diffusion of heavy metal or irradiation of corpuscular ray.

8 Claims, 2 Drawing Sheets

(a)

(b)

(c)

METHOD FOR MANUFACTURING SEMICONDUCTOR DEVICE

BACKGROUND OF THE INVENTION

The present invention relates to a method for manufacturing a semiconductor device such as diode, transistor, thyristor, insulated gate bipolar transistor (IGBT), MOSFET, and the like, having high speed switching characteristics as well as high electric characteristics.

In order to obtain high speed switching response characteristics with a semiconductor device having pn junction, there has been a known method for reducing the lifetime of small number of carriers by diffusing heavy metals such as gold or platinum, or by irradiating corpuscular rays like electron ray, X-ray, proton, and the like.

The method for diffusing the heavy metals such as gold or platinum on a semiconductor layer has been studied for long, but due to the difficulty of control of the diffusion amount and homogenizing, so the method involves a problem of no satisfactory correlation ($h_{FE}$–$t_{stg}$) between the current amplification rate ($h_{FE}$) and the storage time ($t_{stg}$) in the transistor or the like. Furthermore, it is necessary to take care of the prevention of soiling of apparatus such as a post-treatment furnace, and process control is also laborious.

Furthermore, the method of irradiating corpuscular ray is to reduce the lifetime of the carrier because the corpuscular ray having high energy causes a defect to the crystals in the semiconductor layer and forms a deep level. These crystal defects are bound by a restriction that they require to be treated in the course of the latter half of the semiconductor manufacturing process, as the lifetime of the carrier reinstates to the original state through the heat treatment at relatively low temperature to cause loss of effect.

SUMMARY OF THE INVENTION

An object of the present invention is to provide a method for manufacturing a semiconductor device having high speed switching characteristics in stable manner without causing problems in manufacturing process such as diffusion of heavy metal or irradiation of corpuscular ray.

As a result of the strenuous study continued by the present inventors to obtain a semiconductor device which can give high speed switching characteristics in a stabilized condition, it has been found that, by providing epitaxial growth of a semiconductor layer on a wafer not provided with mirror surface finish but having irregularity on the surface, a semiconductor layer having moderate crystal defects grows, and the crystal defects do not show much decrease even in the subsequent manufacturing process accompanied with temperature increase, and moreover, the crystal defects can be stabilized by providing heat treatments by rapid heating-up and rapid cooling-down, thereby making it possible to accelerate the switching speed without causing any problem to the electric characteristics.

The semiconductor manufacturing method of the present invention is characterized by providing epitaxial growth of a semiconductor layer on a surface of a sub-wafer not provided with mirror finishing, introducing impurities having different conductivity type in said epitaxially grown semiconductor layer to form at least a pn junction, and further providing rapid thermal anneal by rapid heating-up and rapid cooling-down in any step in a manufacturing process.

The sub-wafer not provided with mirror surface referred to here is one obtained by providing a surface treatment by wet chemical etching only after slicing to a wafer from an ingot, or, even in case of polishing with a polishing material, by making the final polishing with a polishing material larger than 2 µm in the final polishing, which means the wafer to be obtained by not being provided with polishing with a polishing material of no less than 2 µm in the final polishing. The term of rapid thermal anneal (RTA) by rapid heating-up and by rapid cooling-down means the heat treatment by heating with rapid temperature elevation rate and cooling with rapid temperature descending rate, which means the heat treatment capable, for example, of increasing the temperature within about 1 minute for heating from room temperature to about 850° C. and cooling in about the same rate. The method includes a method of charging the object on a boat having small thermal capacity rapidly in a heating furnace of predetermined temperature, and a method of heating by means of optical lamp such as an infrared lamp, discharge lamp, laser beam lamp, or by high frequency irradiation.

By providing the sub-wafer surface with wet chemical treatment, or by polishing with a polishing material of more than 2 µm, the surface of the above sub-wafer is formed, and by epitaxially growing the above semiconductor layer on the surface, the surface treatment of sub-wafer can be made in a short time to give a semiconductor device having rapid switching speed without requiring time-taking polishing.

Concretely, the sub-wafer surface is processed to surface roughness of 0.001–0.5 µm, more preferably of 0.01–0.5 µm, in a microroughness, and the heat treatment (RTA) may be carried out at 700–900° C. The microroughness means, as shown in FIG. 3, the maximum variation amount between the peak and the trough in about 500 µm length.

It is preferable for the heat treatment (RTA) by rapid heating-up and rapid cooling-down to be carried out after the annealing step in the semiconductor device manufacturing process in the sense of making the crystal defect assured. The above rapid heating-up may be carried out by irradiation of light lamp or by high frequency irradiation.

By allocating the epitaxially grown semiconductor layer to be a collector region, the region formed by introducing the impurities having different conductivity type into the semiconductor layer to be a base region, and introducing the same conductivity type impurities as the semiconductor layer into the base region to form an emitter region, a transistor having increased switching speed can be formed.

DETAILED DESCRIPTION

Figure 1:
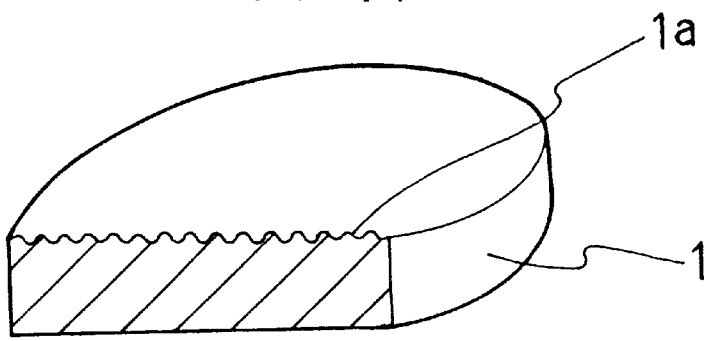
FIG. 1 is a view to show a manufacturing step of an embodiment in the semiconductor device manufacturing method of the present invention.
Figure 1:
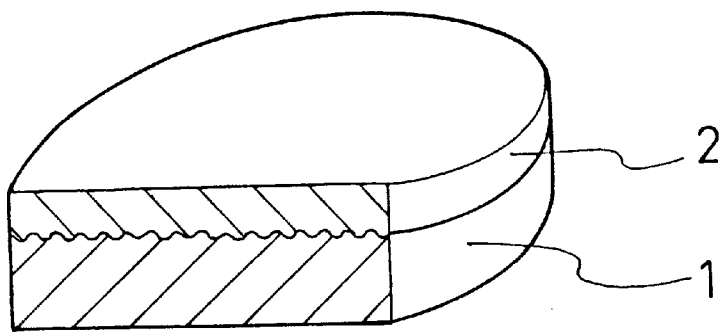
Figure 1:
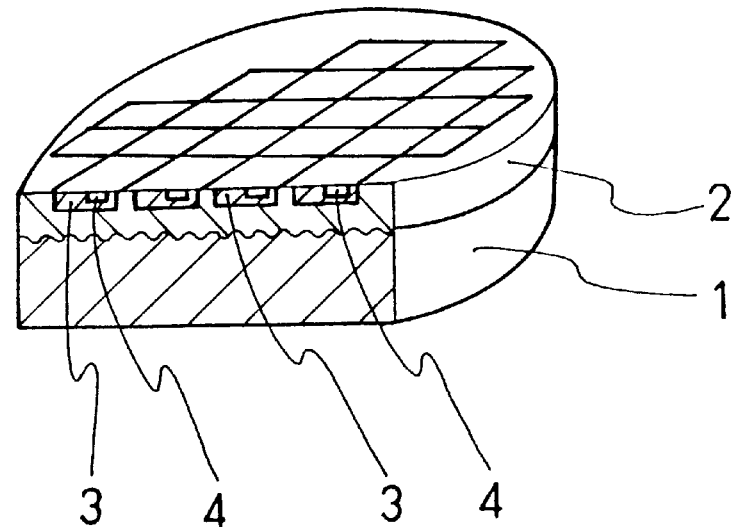

The semiconductor manufacturing method of the present invention is to finish the surface of the sub-wafer which is for example sliced from the ingot by wet chemical etching process or the like so as to make, at first, the surface roughness of the slice face 1a on one side of the sub-wafer 1 about 0.001–0.5 µm, more preferably about 0.01–0.5 µm, as shown in FIG. 1(a). The thickness of this sub-wafer is to be more than 10 µm, preferably about 50–150 µm, more preferably about 80–120 μm. In FIG. 1, the surface roughness of the sub-wafer 1 is illustrated in exaggerated manner. The original surface of sliced sub-wafer is very rough, but as the wet etching amount is increased, the surface is flattened. Thus, by adjusting the etching amount according to the roughness of the sliced condition of surface, the etching amount may be adjusted to give the surface roughness as exemplified above. Even in the case of not relying on the wet chemical etching, or in case of polishing with a polishing material after providing chemical etching to a certain extent, the irregular surface as mentioned above can be obtained by performing polishing with a polishing material of more than 2 μm. The amount of this irregularity can be known for example by a probe method of bringing a probe into contact with the surface or by measuring the reflectivity of laser beam. The surface roughness of the conventional mirror face finishing when measured by this method is no more than 0.1 nm in micro-roughness.

Next, as shown in FIG. 1(b), for example an n-type Si is epitaxially grown on the surface 1a of the sub-wafer 1 to grow a semiconductor layer 2 by for example 10–60 μm. The thickness of the semiconductor layer 2 to be epitaxially grown may differ depending on the objective semiconductor device, and for example in case of manufacturing a power transistor, the layer is to be grown to a thickness of about 30 μm. In case the thickness of the semiconductor layer 2 to be epitaxially grown is thin, preferably the sub-wafer 1 is provided with surface treatment to come to a smaller surface roughness of the range mentioned above. This is because the thicker the thickness of the epitaxial growth layer is, irregularity becomes less on the surface side to show smaller crystal defect, but on the other hand when the growth layer is too thin, the irregularity is not sufficiently reduced to flattening but too large crystal defect causes lowering of the electric characteristics of the device.

Continuously, when, as shown in FIG. 1(c), by introducing for example p-type impurities by diffusion or ion injection or the like, forming a base region 3, and further introducing the n-type impurities in the similar manner to form an emitter region 4, a transistor is formed on a sub-wafer 1 in matrix form.

Subsequently, or after forming for example a base region in the preceding manufacturing process, the transistor is contained in a furnace in which rapid heating-up is made by raising the temperature to about 650–1150° C., followed by allowing to stand for about 10 minutes. Further, after being kept in the furnace for about 1 minute, the sub-wafer 1 is taken out from the furnace to room temperature and subjected to rapid cooling-down. The heat treatment (RTA) by rapid heating-up and rapid cooling-down can be realized by placing the object on a boat having small thermal capacity and taking in and out of the furnace whose temperature is elevated to a predetermined level, or by heating by irradiation of light of infrared lamp, discharge lamp, laser beam, etc. or irradiation of heat beam such as a high frequency irradiation direct to the sub-wafer. In short, heating may be made so as to bring the predetermined temperature to the range of 650–1150° C. in about 1 minute by a rapid heating-up device, and heat treatment may be applied at the same temperature for 1 second or in the period of several seconds to 10 minutes.

The rapid heating-up and rapid cooling-down are made to bring back to the original condition of crystal defect by thermal impact, even if the crystal defect is mended by diffusion process or formation of thermal oxide film, as described later. Preferably the RTA treatment is to be made after completion of the high temperature heat treatment such as diffusion processing. However, as described later, since the base of the crystal defect is a mechanical one based on the irregularity of the surface of the sub-wafer 1, the crystal defect is not eliminated by heat treatment, and as it is possible to make the crystal defect more assured by thermal shock to be exerted by RTA, this is sufficiently effective even without providing the subsequent process.

Thereafter, though not illustrated, a contact hole is formed on the insulating film on the wafer surface, a metal for electrode such as aluminum is coated by sputtering or vacuum deposition process, and patterning is provided to form an electrode. And, by dividing the product into the respective chips, the semiconductors of the present invention are obtainable.

According to the present invention, the semiconductor layer is epitaxially grown on a wafer form semiconductor substrate in sub-wafer condition under the irregular surface condition without having the mirror surface finish. Accordingly, the epitaxially grown semiconductor layer does not become perfect crystal condition, and crystal defect occurs. When the crystal defects are too much the electric characteristics of transistor and the like are deteriorated, but it has been known that, when the above irregularity is about 0.001–0.5 μm of microroughness no abnormality occurs in the electric characteristics. On the other hand, the crystal defect tends to shorten the life of small number carrier by forming the recombination center of carrier. Though there has hitherto been used a method of forming a recombination center of carrier by diffusion of heavy metal or irradiation of electron beam in a transistor or the like to shorten the life τ of the small number carrier, thereby accelerating the switching speed, the above method shows the same action as said conventional method.

The storage time $t_{stg}$ which significantly affects the switching speed is represented by the following expression:

$$t_{stg} = \tau \cdot \ln[I_B \tau / Q_S] \quad (1)$$

where, τ is a life of the small number carriers to be injected in the base; $Q_S$ is a base charge to provide a saturation mode; and $I_B$ is base current, respectively. From the above expression (1) it can be seen that the storage time 'stg depends on the life τ of the small number carriers. Sine, in the present invention, crystal defects are formed by the irregularity of the sub-wafer as described above to become the capture center or recombination center, the life τ of the small number carriers as described above becomes short. As a result, the storage time $t_{stg}$ becomes small.

The recombination center based on the crystal defect according to the present invention is to be formed by a mechanical configuration based on the irregularity of the substrate surface at the time of epitaxially growing the semiconductor layer. Because of this, the center is less apt to be mended by the subsequent annealing treatment or the like. Though diffusion of impurities and annealing treatments are provided in various processes, different from the conventional process of causing the crystal defects to be formed subsequently based on heavy metal diffusion or electron beam irradiation, the present invention process is to provide formation of the crystal defects based on the mechanical configuration, so that there is less case for the reinstatement to be made by the subsequent diffusion step or annealing step. Even under such condition, if a long time heat treatment is provided in a diffusion step or the like, some defects are repaired to lessen the crystal defects. Since, even in this case the mechanical structure itself of irregularity does not show change, the crystal defects based on the irregularity can be induced again by providing rapid thermal annealing to give thermal shock by rapid heating-up and rapid cooling-down, and in the semiconductor layer provided with thermal shock there occurs less tendency to have repair of crystal defect even by subsequent annealing treatment. For this reason, by providing a rapid thermal treatment, stable recombination center can be secured, and semiconductor device which shows faster and stable switching time is obtainable.

Figure 2:
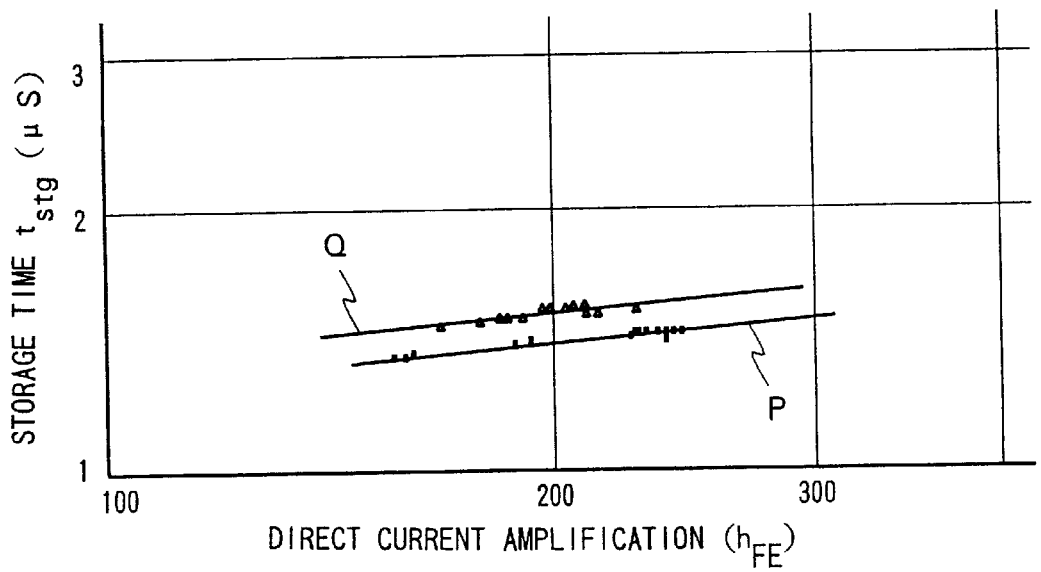
FIG. 2 is a view showing the relation of the storage time $t_{stg}$ to the direct current amplification rate hFE of the transistor manufactured by an embodiment of the manufacturing method of the present invention.
Figure 3:
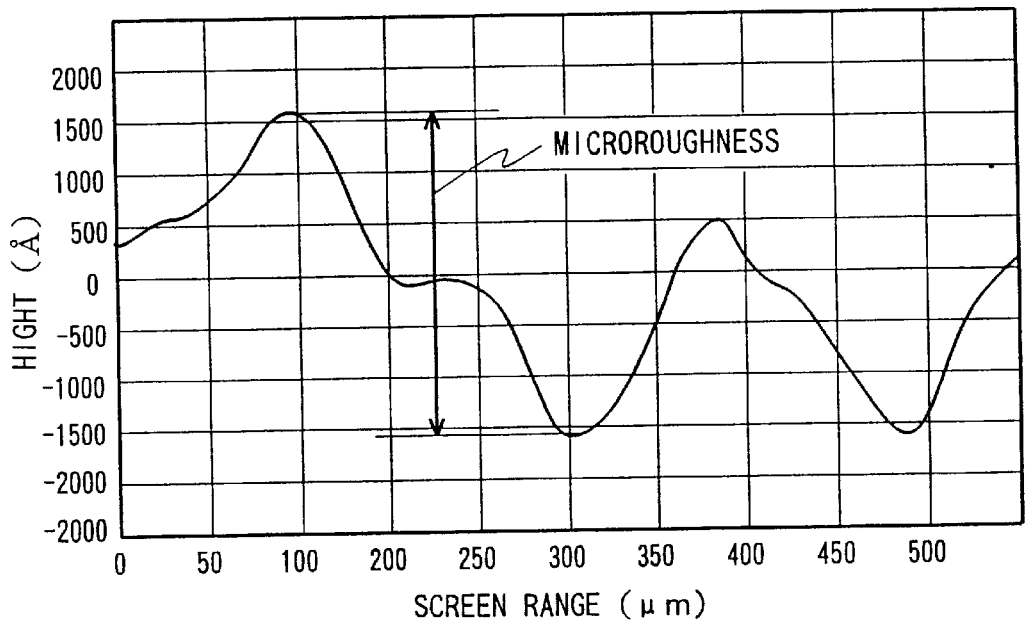
FIG. 3 is an explanatory view of the microroughness.

Using a wafer of a condition sliced from the ingot and provided with etching of about 120 μm by wet chemical etching as mentioned above, a power transistor is manufactured, whose relation of storage time and direct current amplification rate $h_{FE}$ is compared with that of the power transistor manufactured by using the conventional mirror surface finished wafer, and the results are shown in FIG. 2. FIG. 2 shows a direct current amplification rate $h_{FE}$ in the horizontal axis abscissa and the storage time $t_{stg}$ in the vertical axis, where P shows the data of the present invention transistor and Q of the conventional transistor. It can be seen that, according to the present invention, the storage time is smaller and the switching time is shorter than those of the transistor manufactured by using the conventional mirror face finished wafer.

According to the present invention, by forming a crystal defect based on mechanical configuration and further making the crystal defect assured by further rapid thermal anneal, the lifetime of the carrier is shortened with the crystal defect utilized as a center of recombination and the switching speed is made high, so that it does not occur that the crystal defect is mended by diffusion treatment or annealing treatment and the switching time is fluctuated to become unstable. As a result, there can be obtained a semiconductor device which has always stabilized and high speed switching speed.

Furthermore, while conventionally there had been required a long time polishing process for producing a mirror surface, the time for processing can be omitted to realize cost reduction and improvement of switching speed.

Although preferred example have been described in some detail, it is to be understood that certain changes can be made by those skilled in the art without departing from the spirit and scope of the invention as defined by the appended claims.

What is claimed is:

1. A method for manufacturing a semiconductor device comprising:
    (a) growing a semiconductor layer having moderate crystal defects by providing epitaxial growth on a surface of a sub-wafer made of a semiconductor material not provided with mirror finishing without having any other intervening material positioned between the semiconductor layer and the surface of the sub-wafer,
    (b) introducing impurities having different conductivity types in said epitaxially grown semiconductor layer to form at least a pn junction, and
    (c) further providing rapid thermal annealing by rapidly heating-up and rapidly cooling-down in any step in manufacturing said semiconductor device, wherein said surface of said sub-wafer is formed to a roughness of 0.01–0.5 μm in microroughness, and said rapid thermal anneal is carried out at 700–900° C.

2. The manufacturing method according to claim 1, wherein a surface of said sub-wafer is provided with wet chemical etching to form said surface, and said semiconductor layer is epitaxially grown on said surface.

3. A method for manufacturing a semiconductor device comprising:
    (a) providing epitaxial growth of a semiconductor layer on a surface of a sub-wafer not provided with mirror finishing,
    (b) introducing impurities having different conductivity type in said epitaxially grown semiconductor layer to form at least a pn junction, and
    (c) further providing rapid thermal anneal by rapid heating-up and rapid cooling-down in any step in a manufacturing process, wherein a surface of said sub-wafer surface is polished with a polishing material of more than 2 μm to form said surface, and said semiconductor layer is epitaxially grown on said surface.

4. The manufacturing method according to claim 1, wherein said rapid thermal anneal by rapid heating-up and rapid cooling-down is carried out after a heat treatment step in said manufacturing process.

5. The manufacturing method according to claim 1, wherein said rapid thermal anneal is carried out by irradiation of optical lamp or high) frequency band irradiation.

6. The manufacturing method according to claim 1, wherein a transistor is formed by steps comprising:
    forming a collector region by growing epitaxially said semiconductor layer;
    forming a base region by introducing said impurities having different conductivity type to said semiconductor layer; and
    forming an emitter region by introducing same conductivity type impurities as said semiconductor layer into said base region.

7. The manufacturing method of claim 1, wherein said semiconductor layer and said sub-wafer are made of the same material.

8. The manufacturing method of claim 1, wherein said semiconductor layer and said sub-wafer are made of Si.

* * * * *